United States Patent [19]
Horton et al.

[11] Patent Number: 5,944,038
[45] Date of Patent: Aug. 31, 1999

[54] WAFER RESTRAINING DEVICE

[75] Inventors: Stephen D. Horton, Pleasanton; Theodros W. Mariam, San Jose, both of Calif.

[73] Assignee: Advanced Micro Devices, Inc., Sunnyvale, Calif.

[21] Appl. No.: 08/985,818

[22] Filed: Dec. 5, 1997

[51] Int. Cl.[6] ........................................ B08B 3/00
[52] U.S. Cl. .................. 134/182; 134/902; 206/711; 206/454; 269/903; 269/287
[58] Field of Search .................. 134/182, 902; 206/710, 711, 712, 454; 269/903, 287; 211/41.17, 41.18

[56] References Cited

U.S. PATENT DOCUMENTS

| | | | |
|---|---|---|---|
| 4,471,716 | 9/1984 | Milliren | 118/500 |
| 4,687,097 | 8/1987 | Mortensen | 206/334 |
| 4,721,207 | 1/1988 | Kikuchi | 206/334 |
| 4,747,488 | 5/1988 | Kikuchi | 206/444 |
| 5,782,362 | 7/1998 | Ohori | 206/711 |

FOREIGN PATENT DOCUMENTS 000142255A  9/1953  Sweden.

Primary Examiner—Frankie L. Stinson
Assistant Examiner—Paul J. Lee
Attorney, Agent, or Firm—Mikio Ishimaru

[57] ABSTRACT

A wafer restraining device clips onto a semiconductor wafer cassette. The wafer restraining device is provided with at least one opening to allow bubbles forming during acid baths on excess resist-covered semiconductor wafers to escape. Portions of the wafer restraining device only contact the periphery of the sensitive, disc-shaped semiconductor wafers.

7 Claims, 2 Drawing Sheets

WAFER RESTRAINING DEVICE

TECHNICAL FIELD

The invention relates generally to the field of semiconductor manufacturing and more specifically to equipment used in the manufacturing process.

BACKGROUND ART

During the process of manufacturing semiconductors, resist-covered semiconductor wafers are placed into a wafer cassette and subject to megasonic sulfuric acid cleaning. As this cleaning progresses, air bubbles start to form on the front surfaces of the wafers. The air bubbles would continue to form until the adhesion of the bubbles on the surfaces would cause random wafers to float out of the cassette to the top of the acid bath. These random wafers would be improperly cleaned or damaged due to microscratching by particles which also floated to the top of the acid bath.

Investigation of this phenomenon determined that it was caused by extra thick resist on the random wafers. The obvious solution was to standardize the thickness of the resist.

For many years, the only solution to this problem has been to thin the resist to a predetermined thickness. Although it increased the cycle time and required additional handling, the additional process of plasma stripping of excess resist has been a standard operation before acid cleaning. Since the silicon wafers are extremely fragile, no system of clamping the wafers into place in the wafer cassettes was considered workable.

DISCLOSURE OF THE INVENTION

The present invention is a wafer restraining device which is clipped over the wafers in a cassette and onto both sides of the cassette. The wafer restraining device restrains the wafer securely in the cassette and does not contact the front and back surfaces of the wafer. An opening allows free escape of bubbles forming on the wafer during the acid bath and allows full circulation of the cleaning acid. By being held in the cassette, the bubbles increase in size until they remove themselves. This allows improved cleaning of the resist-covered wafers.

The present invention has the advantage of reducing the cycle time involved in manufacturing semiconductor wafers by reducing a step from the process.

The present invention also has the advantage of reducing the potential for defects or breakage due to the elimination of one step in the manufacturing process.

The above and additional advantages of the present invention will become apparent to those skilled in the art from a reading of the following detailed description when taken in conjunction with the accompanying drawings.

BEST MODE FOR CARRYING OUT THE INVENTION

Figure 1:
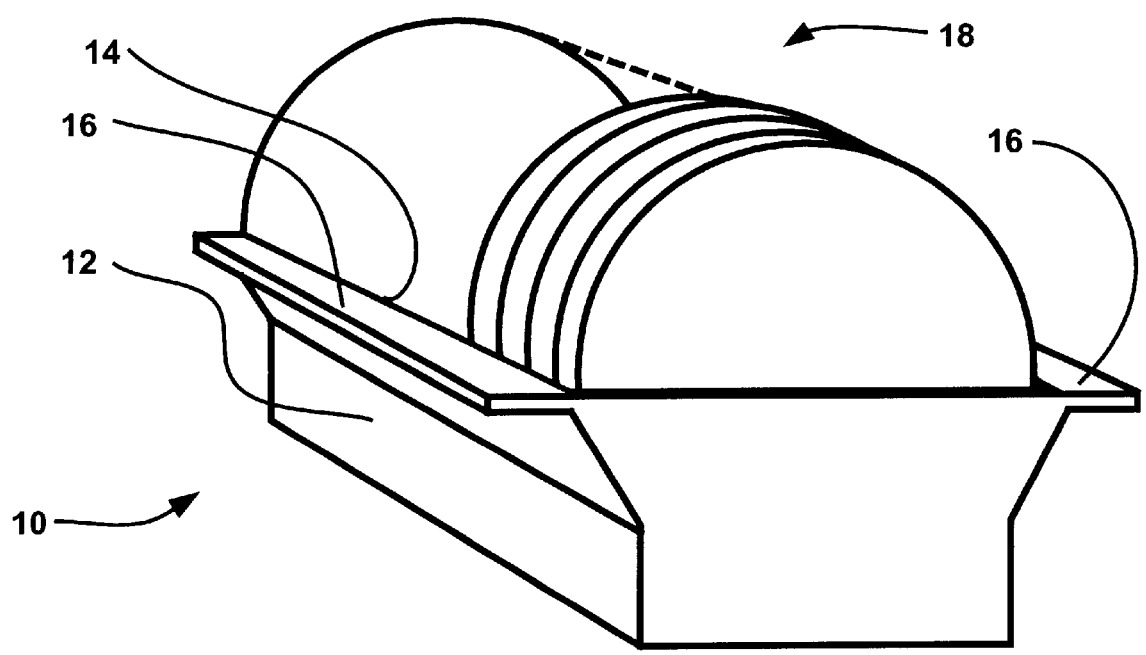
FIG. 1 (PRIOR ART) is an isometric view of a wafer cassette with which the present invention is used.

Referring now to FIG. 1 (PRIOR ART), therein is shown a semiconductor wafer cassette 10 which is also known as a wafer boat or tray. The cassette 10 has a body section 12 with an opening 14. Located around the opening 14 are peripheral rim sections 16. The cassette 10 is made from an acid-resistant material.

The cassette 10 carries a number of disc-shaped, resist-covered silicon wafers 18 which rest in a series of slots (not shown) which are a part of the body 12. These slots are located at preset intervals along the length of the cassette 10 which is parallel to a longitudinal axis which runs through all of the wafers 18. Generally, there are up to twenty-five (25) wafers 18 placed in a cassette 10.

Figure 2:
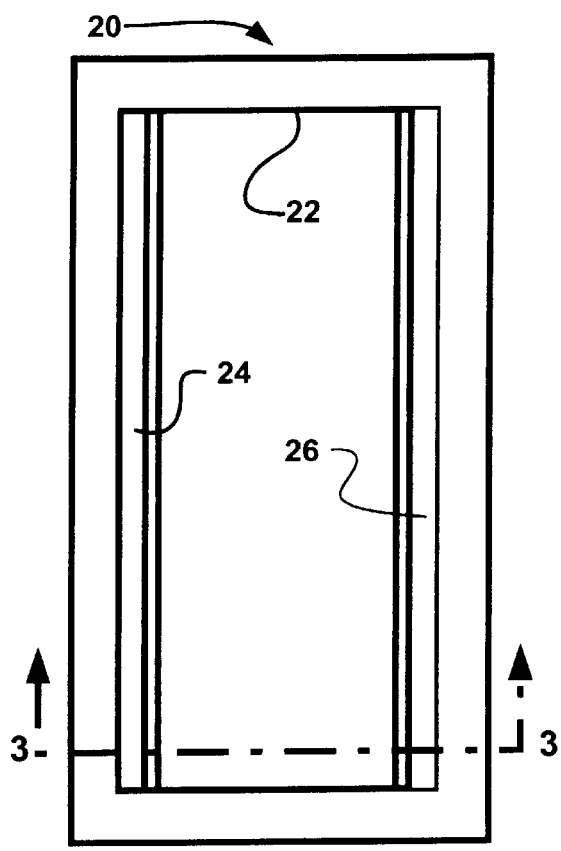
FIG. 2 is a plan view of the present invention.

Referring now to FIG. 2, therein is shown a preferred embodiment of a wafer restraining device 20. The wafer restraining device 20 is generally of a rectangular plate-like configuration having an opening 22 which is approximately the same size as the opening 14 in the cassette 10. On either side of the opening 22 along the length of the wafer restraining device 20 are a pair of flap-like portions 24 and 26. The flap-like portions 24 and 26 are flexible and are sized to hold the wafers 18 in the cassette 10.

The wafer restraining device 20 is preferably made of an acid-resistant, tetrafluoroethylene resin sold under the trademark Teflon. However, it is only necessary that the material be resistant to the particular acid being used in the step for which the wafer restraining device 20 is being utilized.

While the present invention is made from solid Teflon, it should be understood that in situations where the Teflon is insufficiently rigid, formed sheet metal covered by Teflon may also be used without departing from the spirit of the invention.

Figure 3:
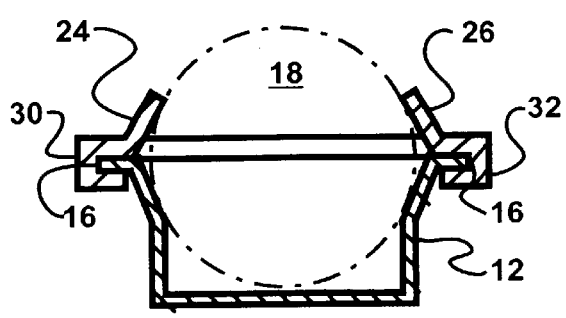
FIG. 3 is a front view of the present invention.

Referring now to FIG. 3, therein is shown a cross-section through line 3—3 of FIG. 2 with a phantom outline of wafers 18 shown. The wafer restraining device 20 is shown with a pair of clip portions 30 and 32 which allow the wafer restraining device 20 to be clipped onto the rim section 16 of the cassette 10. It is preferable that the material of the wafer restraining device 20 be sufficiently flexible that the wafer restraining device 20 will not slide axially or vibrate relative to the wafers 18. As would be evident to those skilled in the art, a number of different holding mechanisms could be used for the same purpose as clip portions 30 and 32.

The flap-like portions 24 and 26 extend inwardly just enough to hold the wafers 18 in place, while just contacting the outer periphery of the wafers 18. The front surface will eventually contain the semiconductor devices so they are highly sensitive to microscratching.

Figure 4:
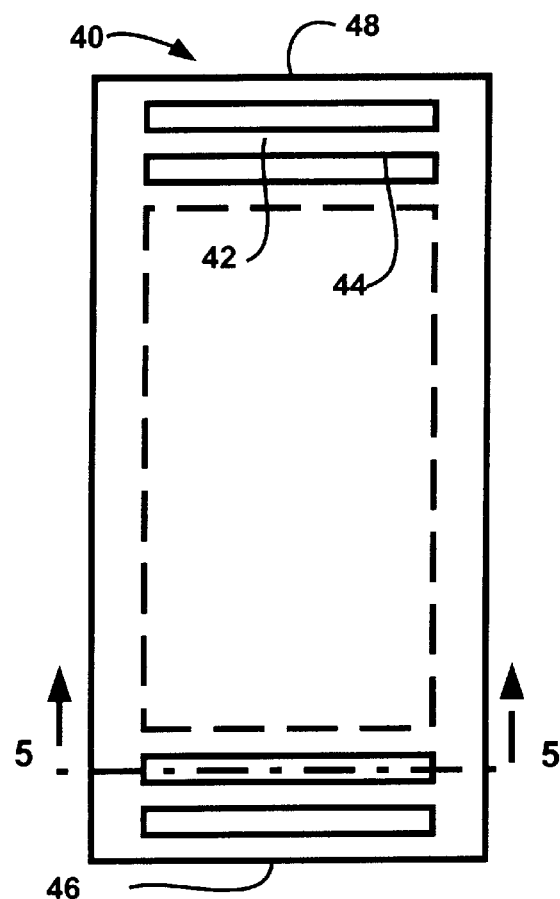
FIG. 4 is a plan view of an alternate embodiment of the present invention.

Referring now to FIG. 4, therein is shown a plan view of an alternate embodiment of the present invention which is a wafer restraining device 40. The wafer restraining device 40 is formed from a plate to have a series of semi-cylindrical portions 42 containing a series of slots 44. The width of the slots 44 approximates the preset intervals between the wafers 18 when they are carried by the cassette 10. The width of the semi-cylindrical portions 42 between the slots 44 is approximately the thickness of the wafers 18. The wafer restraining device 40 is also open at both ends at openings 46 and 48.

The wafer restraining device 40 is also made from a fluorinated hydrocarbon such as Teflon. However, it is again only necessary that the material be resistant to the particular acid being used in the step for which the wafer restraining device 40 is being utilized. While the present invention is made from solid Teflon, it should be understood that in situations where the Teflon is insufficiently rigid, formed and perforated sheet metal covered by Teflon may also be used.

Figure 5:
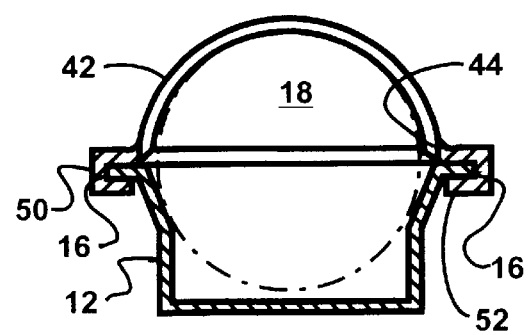
FIG. 5 is a front view of the alternate embodiment of the present invention.

Referring now to FIG. 5, therein is shown a cross-section through line 5—5 of FIG. 4 with phantom outline of wafers 18 shown. The wafer restraining device 40 is shown with a pair of clip portions 50 and 52 which allow the wafer restraining device 40 to be clipped onto the rim section 16 of the cassette 10. It is preferable that the material of the wafer restraining device 40 be sufficiently flexible that the wafer restraining devices 40 will not slide axially or vibrate relative to the wafers 18. As would be evident to those skilled in the art, a number of different holding mechanisms could be used for the same purpose as clip portions 50 and 52. The semi-cylindrical portions 42 are sufficiently wide to hold the wafers 18 into place while just contacting the outer perimeter of the wafers 18.

For a cassette containing twenty-five (25) wafers, there would be twenty-four (24) slots 44 with the opening 46 exposing the front face of a wafer 18 and the opening 48 the backface.

The clip portions 30 and 32 clip onto the length of the rim area 16. It is preferable that the material of the wafer restraining device 20 be sufficiently flexible that the wafer restraining device 20 will not slide axially or vibrate relative to the wafers 18. As would be evident to those skilled in the art, a number of different holding mechanisms could be used for the same purpose as clip portions 30 and 32.

In operation of the preferred embodiment, the resist-coated wafers 18 are inserted in the cassette 10 and the wafer restraining device 20 is clipped over the rim portion 16 of the cassette 10. The whole tray 10 and the wafer restraining device 20 are totally immersed in a megasonic sulfuric acid cleaning bath. Bubbles begin to form on the surfaces of the wafers 18. Without the wafer restraining device 20 and in situations where the resist is too thick, the adhesion between the newly formed bubbles would eventually lift the wafers 18 out of the cassette 10 and allow them to float free, one side up in the acid bath. With the wafer restraining device 20, the bubbles will continue to grow in size until the buoyancy force of the bubbles exceeds the adhesion force against the surface of the wafers 18, and the bubbles lift free of the wafers 18 and allow acid access to the surface. The flap-like portions 24 and 26 extend inwardly enough to hold the wafers 18 in place but not enough to allow bubbles to accumulate on their undersides.

In operation of the alternate embodiment of the present invention, the resist-coated wafers 18 are inserted in the cassette 10 and the wafer restraining device 40 is clipped over the rim portion 16 of the cassette 10. The cassette 10 and the wafer restraining device 40 are totally immersed in the megasonic sulfuric acid bath. In situations where the resist is too thick, bubbles begin to form on the surfaces of the wafers 18. Without the wafer restraining device 40, the adhesion between the newly formed bubbles would eventually lift the wafers 18 out of the cassette 10 and allow them to float free, one side up in the acid bath. With the wafer restraining device 40, the bubbles will continue to grow in size until the buoyancy force of the bubbles exceeds the adhesion force against the surface of the wafers 18, and the bubbles lift free of the wafers 18 and allow acid access to the surface.

The length of the slots 44 is sufficient to allow the bubbles to float out of the area of the wafers 18 without restriction and to expose the entire surface of the wafers 18 to the acid in a vertical direction. The semi-cylindrical portions 42 are also narrow enough that bubbles will not collect on their undersides.

While the invention has been described in conjunction with a specific best mode and alternate embodiment, it is to be understood that many alternatives, modifications, and variations will be apparent to those skilled in the art in light of the aforegoing description. Accordingly, it is intended to embrace all such alternatives, modifications, and variations which fall within the spirit and scope of the included claims. All matters set forth herein or shown in the accompanying drawings are to be interpreted in an illustrative and non-limiting sense.

The invention claimed is:

1. A wafer restraining device to be used in conjunction with a semiconductor wafer cassette during an acid bath process in the manufacture of cylindrical; disc-shaped semiconductor wafers comprising:

a body of an acid-resistant material;

said body having a retaining portion having an opening provided therein for the free escape of bubbles and acid from the surface of a semiconductor wafer;

a flexible portion capable of conforming to and contacting the cylindrical surface of the cylindrical, disc-shaped semiconductor wafer and allowing free escape of bubbles and acid from the surface of the semiconductor wafer through said opening; and said body having a holding portion capable of engaging the wafer cassette to hold said body to the wafer cassette.

2. The wafer restraining device as claimed in claim 1 wherein said flexible portion has flap-like portions, extending in the direction of the free escape of bubbles and acid.

3. The wafer restraining device as claimed in claim 1 wherein said opening provided in said body is adjacent one noncylindrical surface of the semiconductor wafer and said body has a second opening provided therein adjacent the second noncylindrical surface of the semiconductor wafer.

4. A wafer restraining device to be used in conjunction with a semiconductor wafer cassette during an acid bath process in the manufacture of cylindrical, disc-shaped semiconductor wafers comprising:

a rectangular plate of an acid-resistant material having an opening provided therein;

said rectangular plate having a clip-shaped portion for clipping said rectangular plate onto the wafer cassette; and said rectangular plate having flap-like portions adjacent said opening for contacting the cylindrical surface of the cylindrical, disc-shaped semiconductor wafers whereby gas bubbles forming on the noncylindrical semiconductor wafer surfaces freely escape through said opening to the surface of the acid and the acid circulates past the noncylindrical surfaces of the semiconductor wafers.

5. The wafer restraining device as claimed in claim 4 wherein said wafer restraining device is made of tetrafluoroethylene resin.

6. A wafer restraining device to be used in conjunction with a semiconductor wafer cassette, having two longitudinal rims, during an acid bath process in the manufacture of cylindrical, disc-shaped semiconductor wafers comprising:

a rectangular plate of an acid resistant material formed into a semi-cylindrical portion having an area for contacting the cylindrical surface of the cylindrical, disc-shaped semiconductor wafers;

said rectangular plate having two longitudinal clip-shaped portions for clipping said rectangular plate to the respective two longitudinal rims on the wafer cassette; and said rectangular plate having a plurality of lateral slots provided in said semi-cylindrical portion adjacent to the area for contacting the cylindrical surface of the disc-shaped semiconductor wafers whereby gas bubbles forming on the noncylindrical semiconductor wafer surfaces to freely escape through said slots to the surface of the acid and the acid circulates past the noncyclindrical surfaces of the disc-shaped semiconductor wafers.

7. The wafer restraining device as claimed in claim 6 wherein said wafer restraining device is made of tetrafluoroethylene resin.

* * * * *